United States Patent
Ozeki et al.

(10) Patent No.: US 6,765,266 B2
(45) Date of Patent: Jul. 20, 2004

(54) SEMICONDUCTOR DEVICE WITH PERIPHERAL PORTION FOR WITHSTANDING SURGE VOLTAGE

(75) Inventors: Yoshihiko Ozeki, Anjo (JP); Yutaka Tomatsu, Okazaki (JP); Norihito Tokura, Okazaki (JP); Haruo Kawakita, Okazaki (JP)

(73) Assignee: Denso Corporation, Kariya (JP)

( * ) Notice: Subject to any disclaimer, the term of this patent is extended or adjusted under 35 U.S.C. 154(b) by 51 days.

(21) Appl. No.: 10/308,085

(22) Filed: Dec. 3, 2002

(65) Prior Publication Data

US 2003/0107102 A1 Jun. 12, 2003

(30) Foreign Application Priority Data

Dec. 7, 2001 (JP) .................................... 2001-374256

(51) Int. Cl.[7] .............................................. H01L 23/60
(52) U.S. Cl. ...................... 257/355; 257/603; 257/630
(58) Field of Search .................................. 257/355, 356, 257/360, 603, 630

(56) References Cited

U.S. PATENT DOCUMENTS

| 5,324,971 A | * | 6/1994 | Notley ........................ 257/356 |
| 5,475,258 A | | 12/1995 | Kato et al. ................... 257/603 |
| 5,959,345 A | * | 9/1999 | Fruth et al. .................. 257/603 |

FOREIGN PATENT DOCUMENTS

| JP | A-10-163482 | 6/1998 |
| JP | A-2002-184988 | 6/2002 |

* cited by examiner

Primary Examiner—Gene M. Munson
(74) Attorney, Agent, or Firm—Posz & Bethards, PLC

(57) ABSTRACT

In a semiconductor device of the present invention, a first semiconductor region is formed so that a peripheral edge thereof is located between a first field plate ring that corresponds to one of field plate rings located at the innermost side thereof and a second field plate ring that corresponds to one of the field plate rings adjacent the first plate ring. Accordingly, when a surge voltage is applied to the semiconductor device of the present invention, an electric field concentration at a part of the isolation film located under the first one of the field plate rings is relaxed and an electric field intensity decreases. Therefore, the reliability of the isolation film for withstanding the surge voltage increases.

21 Claims, 6 Drawing Sheets

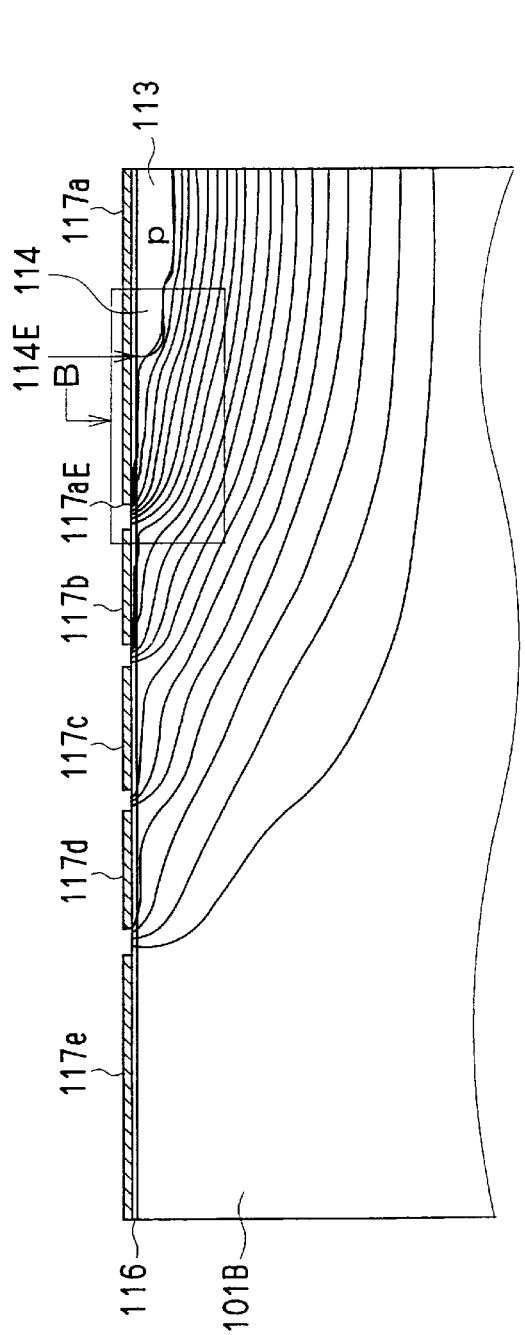
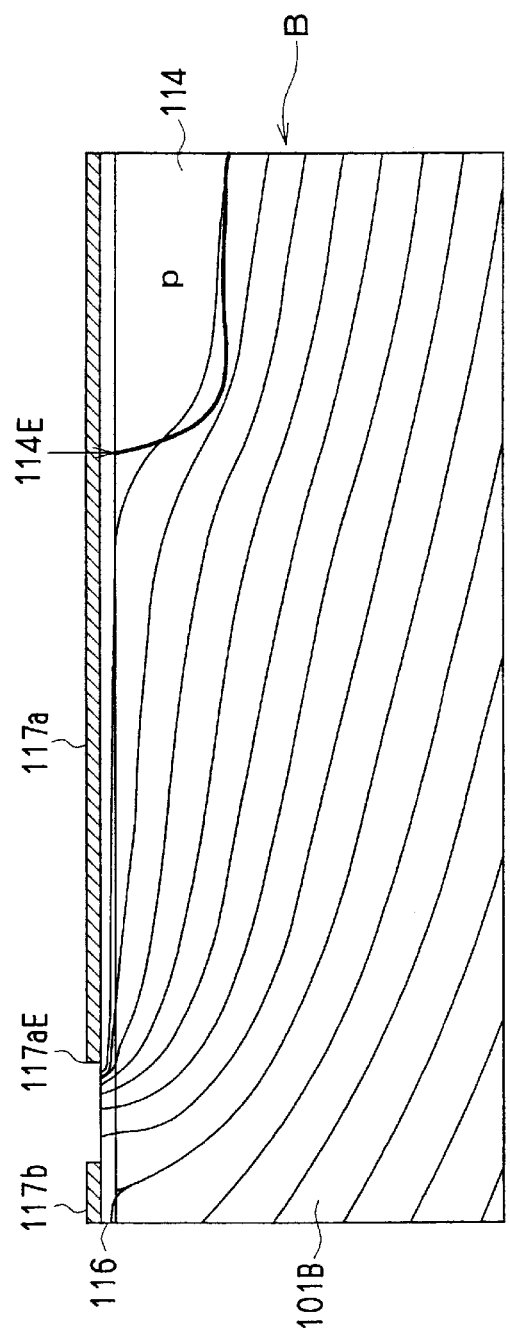
FIG. 6A *RELATED ART*
FIG. 6B *RELATED ART*

SEMICONDUCTOR DEVICE WITH PERIPHERAL PORTION FOR WITHSTANDING SURGE VOLTAGE

CROSS REFERENCE TO RELATED APPLICATION

This application is based upon and claims the benefit of Japanese Patent Application No. 2001-374256 filed on Dec. 7, 2001, the contents of which are incorporated herein by reference.

FIELD OF THE INVENTION

The present invention relates generally to semiconductor devices, and more particularly to a semiconductor device with a peripheral portion for withstanding a surge voltage.

BACKGROUND OF THE INVENTION

Conventionally, a semiconductor device including an IGBT or the like has a peripheral portion for withstanding a surge voltage (e.g., JP-A-10-163482).

FIG. 5 shows a cross sectional view of such a semiconductor device with an IGBT. IGBT elements (hereinafter referred to as a cell portion) are formed on a right side of the device in FIG. 5. A peripheral portion for withstanding a surge voltage caused by power surge (hereinafter referred to as a peripheral voltage withstand portion) is formed on a left side of the cell portion.

A semiconductor substrate 101 includes a p+ type layer 101A and an n− type layer 101B disposed on the p+ type layer 101A. A side of the p+ type layer 101A of the semiconductor substrate 101 is a reverse surface 101a on which a collector electrode 102 is formed, and a side of the n− type layer 101B is a main surface 101b.

In the peripheral voltage withstand portion, a peripheral p type well region 113 is formed on a surface portion of the n− type layer 101B. A p type well region 114, which is shallower than the peripheral p type well region 113, is formed at the most peripheral position of the peripheral p type well region 113 so as to overlap therewith. Hereinafter, the p type well region 114 is referred to as a most peripheral well region. In a most peripheral position of the semiconductor device, an n+ region 115 is formed on the surface portion of the n− layer 101B to surround the cell portion and the most peripheral well region 114.

A LOCOS oxide film 116 is formed on the main surface 101b of the n− type layer 101B and a plurality of field plate rings 117a–117e formed thereon are disposed from the peripheral p type well region 113 to an edge of the n+ type region 115 on a side of the cell portion. Zener diodes 118a–118d made of poly-silicon or the like are disposed on the field plate rings 117a–117e. Each of the zener diodes 118a–118d is disposed between and electrically contacts adjacent field plate rings 117a–117e. The field plate ring 117a is electrically connected to a gate electrode 119, and the field plate ring 117e is electrically connected to the n+ region 115.

In the above semiconductor device, each of the field plate rings 117a–117e and each of the Zener diodes 118a–118d are alternatively disposed at predetermined intervals in the cell portion to a periphery of the cell portion. Therefore, in the n− type layer 101B, an electric potential is distributed uniformly in a direction from the peripheral p type well region 113 to the most peripheral well region 114 when a surge voltage is applied to the semiconductor device. The surge voltage applied to the semiconductor device is distributed along a surface of the n− type layer 101B, and therefore an electric field is prevented from being locally concentrated.

Further, in the above semiconductor device, the most peripheral well region 114 with a shallow and relatively low impurity concentration is located at a periphery of the peripheral p type well region 113, and the field plate ring 117a located at the innermost side of the field plate rings 117a–117e protrudes from a peripheral edge 14aE of the most peripheral well region 114 in a peripheral direction. Accordingly, curvature of a peripheral edge of the peripheral p type well region 113 and an electric field distribution feature near the edge is improved, and local concentration of the electric field is prevented.

SUMMARY OF THE INVENTION

FIG. 6A shows an equipotential line distribution of a cross section of the semiconductor device of FIG. 5 calculated based on a simulation analysis. FIG. 6B shows an expansion view of a region B near a peripheral edge 117aE of the field plate ring 117a of FIG. 6A. In the simulation, dV/dt is about 2 kV/ns. When a reverse bias is applied to the semiconductor device, a depletion layer formed by a PN junction of the n− type layer 101B and the peripheral p type well region 113 extends in a side of the peripheral p type well region 113 from the PN junction. Since the depletion layer extends from the peripheral p type well region 113 in a further peripheral direction thereof, the equipotential line distributes as in FIG. 6A based on the electric potential of the field plate rings 117a–117e.

However, as shown in FIG. 6B, because the peripheral edge 114aE of the most peripheral well region 114 separates from the field plate ring 117a and the field plate ring 117b neighboring the field plate ring 117a, the equipotential line extends from the most peripheral well region 114 and the peripheral p type well region 113 to the portion disposed between both field plate rings 117a, 117b along the LOCOS oxide layer 116. Therefore, the equipotential line concentrates in a part of the LOCOS oxide film 116 under the peripheral edge 117aE of the field plate ring 117a, and an electric field intensity increases at the part of the LOCOS oxide film 116. Accordingly, reliability of the LOCOS oxide film 116 for withstanding the surge voltage, especially a rapid surge voltage, may decrease.

It is therefore an object of the present invention to provide a semiconductor device that is capable of obviating the above problem.

It is another object of the present invention to provide a semiconductor device with an oxide film having increased reliability for withstanding surge voltage.

According to a semiconductor device of the present invention, a first semiconductor region is formed so that a peripheral edge thereof is located between a first field plate ring that corresponds to one of the field plate rings located at the innermost side thereof and a second field plate ring that corresponds to one of the field plate rings neighboring the first plate ring.

As the first semiconductor region is not completely depleted by a depletion layer, it is preferable that an edge of the depletion layer extended to the first semiconductor layer is located between or near the first field plate ring and the second field plate ring. Further, when a reduced surface field (resurf) configuration is connected to the periphery of the first semiconductor region, the peripheral edge of the first semiconductor layer can be defined by correlating it to a position located between a first field plate ring and the second field plate ring.

Accordingly, when a surge voltage is applied to the semiconductor device of the present invention, an electric field concentration at a part of the isolation film located under the first one of the field plate rings is relaxed and an electric field intensity decreases. Therefore, the reliability of the isolation film for withstanding surge voltage increases.

BRIEF DESCRIPTION OF THE DRAWINGS

Other objects, features and advantages of the present invention will be understood more fully from the following detailed description made with reference to the accompanying drawings. In the drawings:

FIG. 6A is a schematic view showing an equipotential line distribution of related art semiconductor device shown in FIG. 5; and FIG. 6B is an enlarged view of a portion of the related art semiconductor device of FIG. 6A.

DETAILED DESCRIPTION OF THE PREFERRED EMBODIMENT

Figure 1:
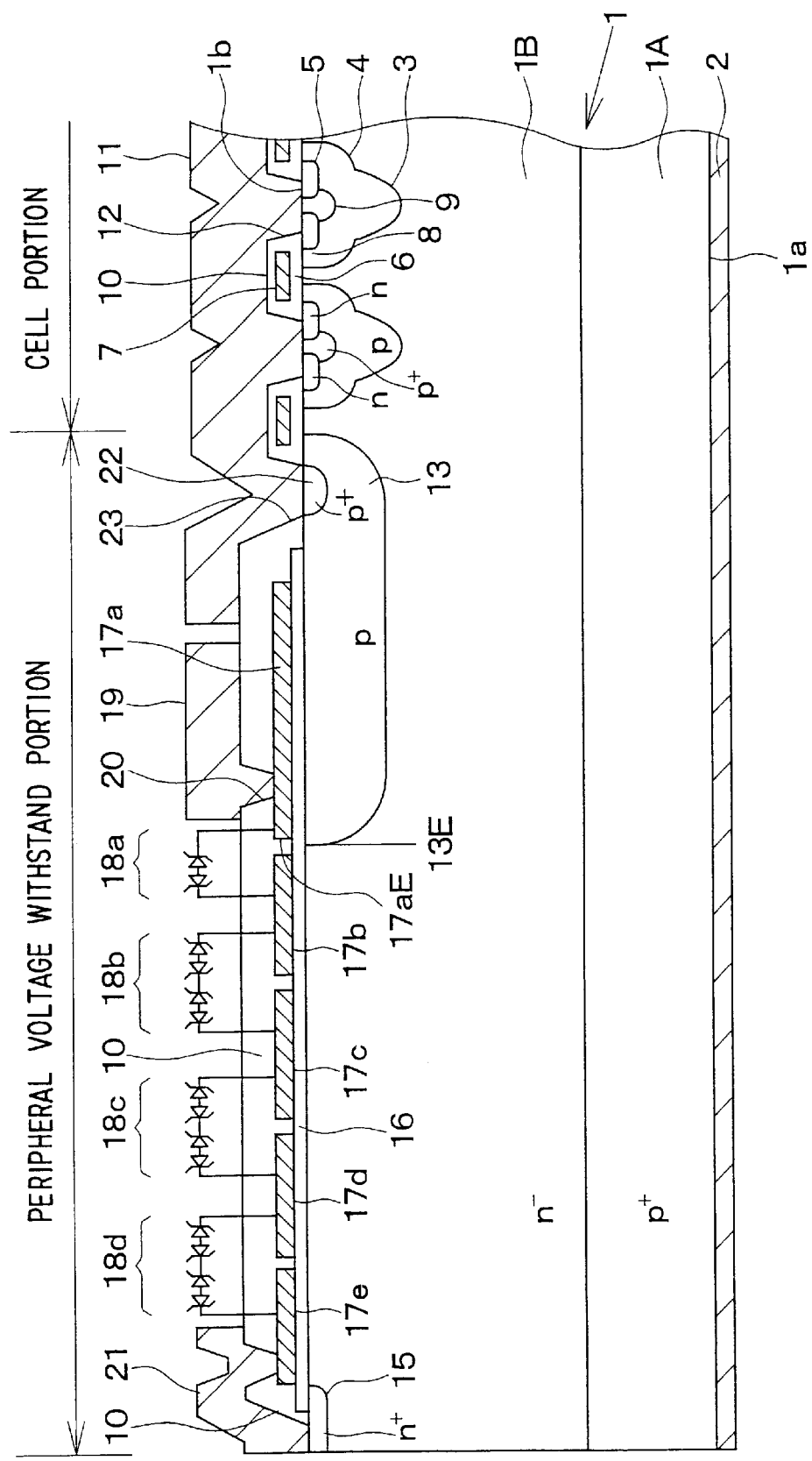
FIG. 1 is a cross sectional view showing a semiconductor device according to a first embodiment of the present invention.

The present invention will be described further with reference to various embodiments shown in the drawings.

(First Embodiment)

FIG. 1 shows a cross sectional view of a semiconductor device including an IGBT. A cell portion (an element portion) is formed on a right hand side of the IGBT, and a peripheral voltage withstand portion is formed on a left side of the IGBT from the cell portion. A semiconductor substrate 1 on which a semiconductor chip is configured includes a p+ type layer 1A, and an n− type layer (a first conductive type layer) 1B disposed on the p+ type layer 1A on which a collector electrode 2 is formed as in FIG. 5.

In the cell portion, a p type well region 3 is formed on the surface region of the n− layer 1B. A p type base region 4 overlapping the p type well region is also formed on the surface region of the n− layer 1B. The p type base region 4 is shallower than the p type well region 3. An n+source region 5 is formed inside of the p type base region 4. A gate electrode (a second main electrode) 7 made of poly-silicon or the like is formed on the n− type layer 1B through a gate isolation layer 6. A part of the p type base region 4 disposed under the gate electrode 7 and between the n+type source region 5 and the n− type layer 1B corresponds to a channel region 8.

A p+ type region 9 is formed at a part of a surface region of the p type base region 4 that is opposite to the side of the channel region 8 relative to the n+ type source region 5 so as to overlap with the n+ type source region 5. The surface of the n− type layer 1B is covered with an interlayer isolation film 10 made of BPSG (Boro-PhosphoSilicate Glass), PSG (PhosphoSilicate Glass) or the like on which an emitter electrode (a first main electrode) 11 made of Al alloy or the like is formed. The emitter electrode 11 electrically contacts the n+ type source region 5 and p+ type region 9 through contact holes 12 formed in the interlayer isolation film 10.

According to the above configuration, the cell portion includes several unit cells, each being formed by elements such as the p type base region 4, the n+ type source region 5, the p+ type region 9, emitter electrode 11 and the gate electrode.

In the peripheral voltage withstand portion, a peripheral p type well region (a second conductive type region) 13 having a depth identical to that of the p type well region 3 is formed on the surface region of the n− type layer 1B to surround the cell portion. In a most peripheral position of the semiconductor device, an n+ region (a first conductive type region) 15 is formed on the surface portion of the n− layer 1B to surround the cell portion and the peripheral p type well region 13.

A LOCOS oxide film 16 is formed on the main surface 1b of the n− type layer 1B. Field plate rings 17a–17e are also formed on the main surface 1b and are disposed from the peripheral p type well region 13 to an edge of the n+ region 15 on a left side of the cell portion. Zener diodes 18a–18d made of poly-silicon or the like are disposed on the field plate rings 17a–17e and are connected in a back to back manner as protection elements.

The LOCOS oxide film 16 is covered with an interlayer isolation film 10 on which a gate electrode 19 is formed. The gate electrode 19 electrically connects to the field plate ring 17a through a contact hole 20 formed in the interlayer isolation film 10. At the outermost periphery of the semiconductor device, an equipotential plate 21 is formed on the interlayer isolation film 10 and electrically connects to the field plate ring 17e and the n+ type region 15. That is, a first voltage applied to the peripheral p type well region and gate electrode 19 is applied to the field plate ring 17a and a third voltage applied to the n− type layer 1B through the n+ region 15 is applied to the field plate ring 17e. Therefore, a second voltage that is closer than the first voltage to the third voltage is applied to the field plate ring 17b neighboring to the field plate ring 17a. A fourth voltage that is closer than the third voltage to the first voltage is applied to the field plate ring 17d.

According to the semiconductor device of the present embodiment, a carrier concentration of the peripheral p type well region 13 is higher than that of the n− type layer 1B. Therefore, when a reverse bias is applied to the semiconductor device, a depletion layer is hardly formed inside of the peripheral p type well region 13. Further, in the peripheral voltage withstand portion, the peripheral p type well region 13 is formed so that a peripheral edge 13E thereof is located between the field plate ring 17a connected with gate wiring 19 and the field plate ring 17b neighboring the field plate ring 17a.

Figure 2A:
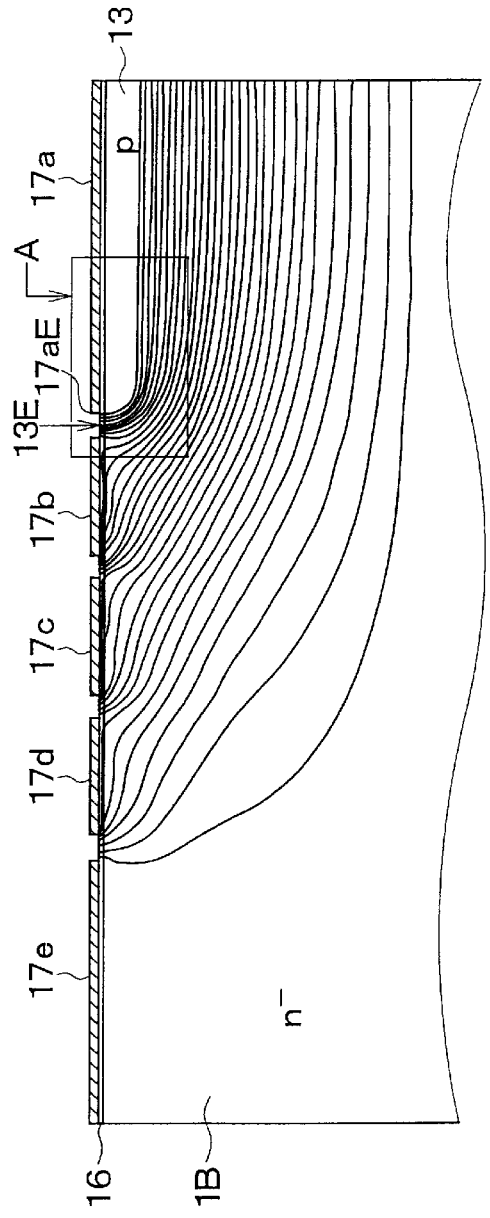
FIG. 2A is a schematic view showing an equipotential line distribution of the semiconductor device according to the first embodiment of the present invention.
Figure 2B:
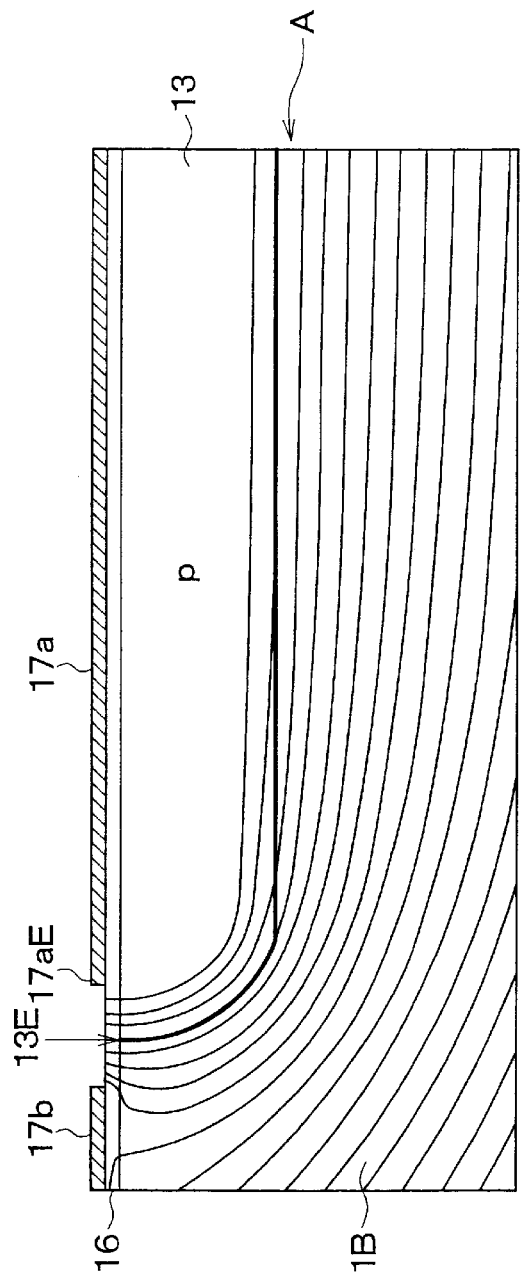
FIG. 2B is an enlarged view of a portion of FIG. 2A.

FIG. 2A shows an equipotential line distribution of a cross section of the semiconductor device of FIG. 1 calculated based on a simulation analysis. FIG. 2B shows an enlarged view of a region A near a peripheral edge 17aE of the field plate ring 17a of FIG. 2A. In the simulation, dV/dt is about 2 kV/ns.

In the semiconductor device of the present embodiment, a peripheral edge 13E of the peripheral p type well region 13 is located between the field plate ring 17a and the field plate ring 17b. Therefore, as shown in FIG. 2B, a depletion layer formed by a PN junction of the n– type layer 1B and the peripheral p type well region 13 is generated along an outline of the peripheral p type well region 13. The equipotential line extents perpendicular to the LOCOS oxide film 16 located between the field plate rings 17a, 17b. Accordingly, the equipotential line does not concentrate in the part of the LOCOS oxide film 16 under the peripheral edge 17aE of the field plate ring 17a.

Thus, when a surge voltage is applied to the semiconductor device of the present embodiment, an electric field concentration at the part of the LOCOS oxide film 16 is relaxed and an electric field intensity decreases. Therefore, the reliability of the LOCOS oxide film 16 for withstanding the surge voltage increases.

If the peripheral edge 13E of the peripheral p type well region 13 is located far inside the peripheral edge 17aE of the field plate ring 17a, as shown in FIG. 6B, the electric field concentrates at the peripheral edge 17aE when surge voltage is rapidly applied to the semiconductor device. To the contrary, if the peripheral edge 13E of the peripheral p type well region 13 is located well outside of the peripheral edge 17aE of the field plate ring 17a, an intensity of an electric field under the field plate ring 17b increases. Further, a breakdown is caused on a surface of the n– type layer 1B. Therefore, it is preferable that a peripheral edge 13E of the peripheral p type well region 13 is located between the field plate ring 17a and the field plate ring 17b.

Figure 5:
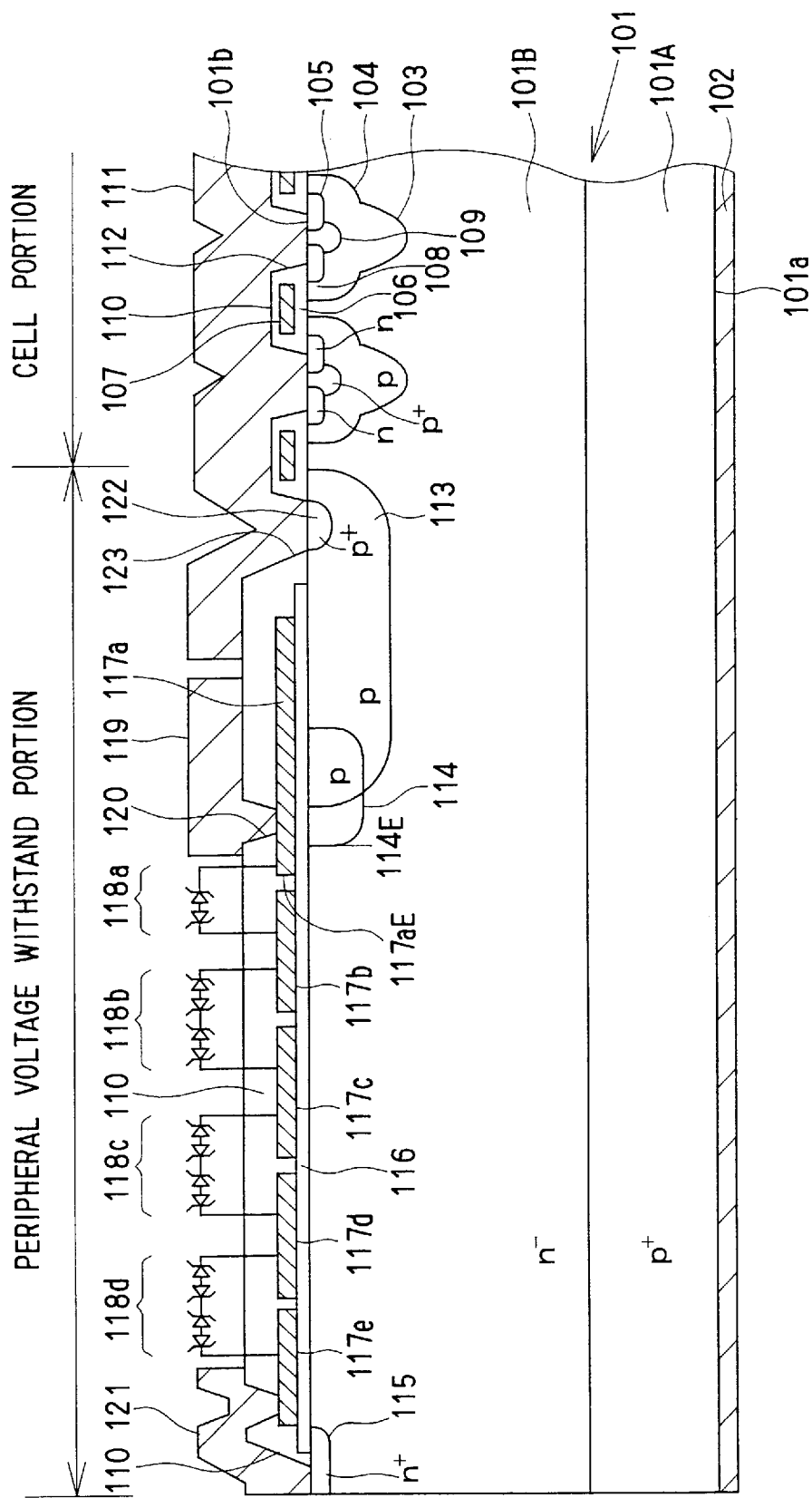
FIG. 5 is a cross sectional view showing a semiconductor device according to a related art semiconductor device.

Further, in the semiconductor device of the present embodiment, the peripheral p type well region 13 is defined as follows: an impurity concentration is $1.0 \times 10^{17}$ cm$^{-3}$ to $1.0 \times 10^{18}$ cm$^{-3}$, and a depth is 7 µm. The most peripheral well region (low concentration region) 114 illustrated in FIG. 5 is not formed in the semiconductor device of the present embodiment. Thus, a curvature radius of a curve portion of the peripheral p type well region 13 can be smaller than that of the peripheral p type well region 113 as in FIG. 5.

In the configuration, since the electric field concentrates, and the electric field intensity increases, at the curve portion of the peripheral p type well region 13, a withstanding voltage of the peripheral voltage withstand portion decreases.

However, a withstanding voltage of the cell portion may also be decreased due to the configuration. Accordingly, to prevent the withstanding voltage of the cell portion from decreasing, the n– type layer 1B of the present semiconductor device is defined so that an impurity concentration thereof is lower and a thickness thereof is larger than that of the present semiconductor device illustrated in FIG. 5. For example, the n-type layer 1B may have an associated impurity concentration of $1.4 \times 10^{14}$ cm$^{-3}$, and a depth of 7 µm.

Therefore, a depletion layer formed by a PN junction of the n– type layer 1B and p type regions 3, 4 (the p type well region 3 and the p type base region 4) may be to enlarged as an extension thereof, and an electric field distribution in the depletion layer may also be extended. Thus, it is possible to prevent the withstanding voltage of the cell portion from decreasing.

Regarding the peripheral voltage withstand portion, even if the n– type layer 1B of the present semiconductor device is defined so that an impurity concentration thereof is lower and a thickness thereof is larger than that of the related art semiconductor device illustrated in FIG. 5, the withstanding voltage thereof does not increase. This is because the curvature radius of the curve portion of the peripheral p type well region 13 is smaller than that of the related art peripheral p type well region 113 in FIG. 5, and the depletion layer does not extend from the curvature portion when compared with a flat portion. For example, the withstanding voltage of the peripheral voltage withstand portion is 70V or more (specifically, approximately 100V, in the present embodiment) lower than that of the cell portion.

Therefore, when the surge voltage is applied to the semiconductor of the present embodiment, a breakdown current flowing into the cell portion can be decreased because the peripheral p type well region 13 of the peripheral voltage withstand portion will be broken down faster than the cell portion. As a result, a carrier density in the cell portion decreases, and therefore a parasitic transistor, which is formed by the n– type layer 1B of the cell portion, the p type base region 4 and the n+ source region 5, is prevented from operating. For example, a surge withstanding voltage of the semiconductor device of the present embodiment may be twice that of the related semiconductor device in FIG. 5.

Incidentally, an electrode, a first conductive type semiconductor layer, a semiconductor layer of second conductive type, and a second semiconductor layer of second conductive type correspond to the emitter electrode 11, the n– type layer 1B, the peripheral p type well region 13, the p type well region 3 and the p type base region 4 respectively.

(Modifications)

Figure 3:
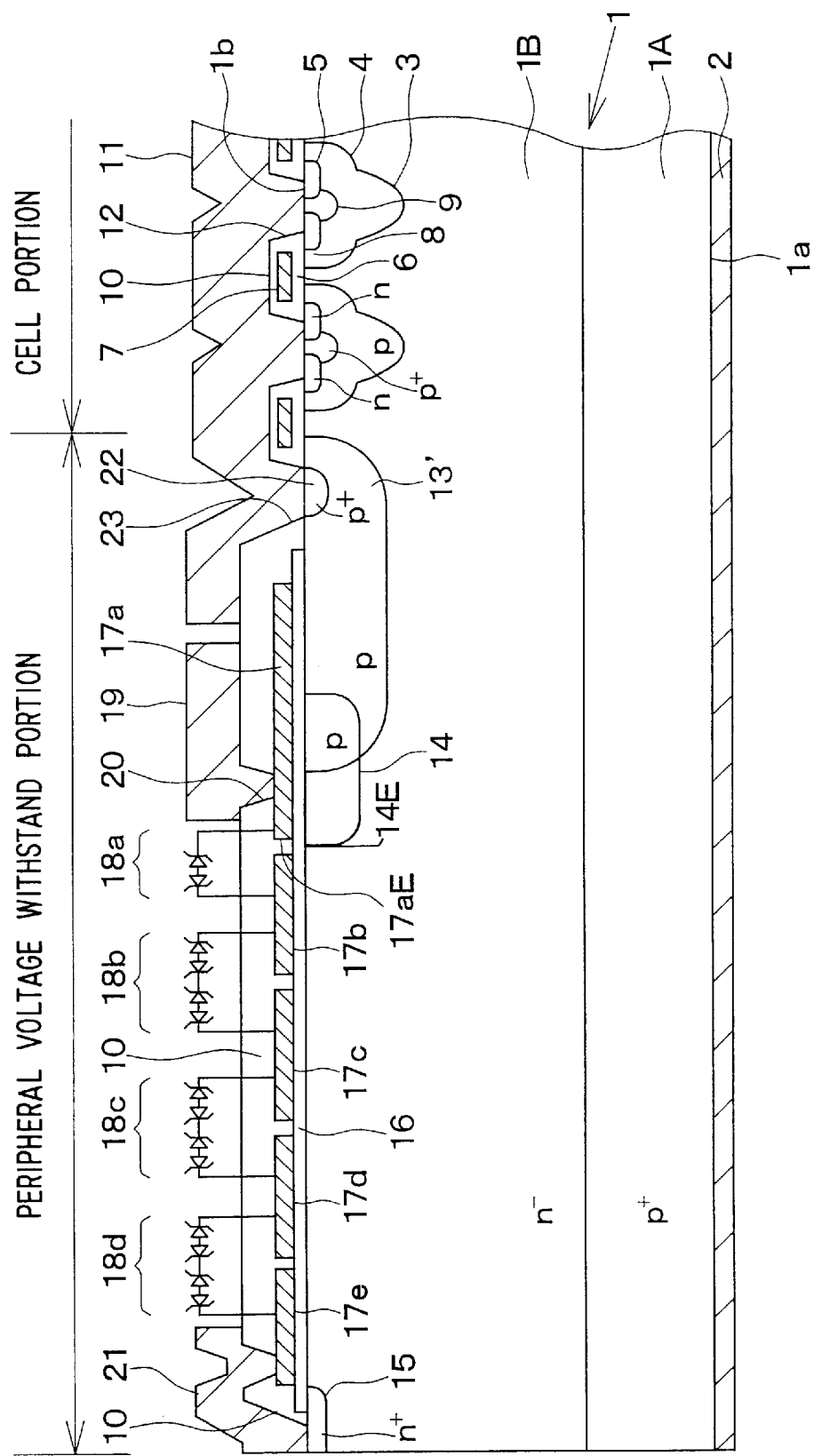
FIG. 3 is a cross sectional view showing a semiconductor device according to a modified embodiment of the present invention.

In the first embodiment, the most peripheral well region 114 illustrated in FIG. 5 can alternatively be adapted so that a peripheral portion 14E of the most peripheral well region 14 is located between the field plate ring 17a and the field plate ring 17b. In this case, as shown in FIG. 3, an impurity concentration of the most peripheral well region 14 is defined so that the most peripheral well region 14 is not completely depleted when a reverse bias is applied to the semiconductor device. According to the configuration, the reliability of the LOCOS oxide film 16 for withstanding the surge voltage increases.

Figure 4:
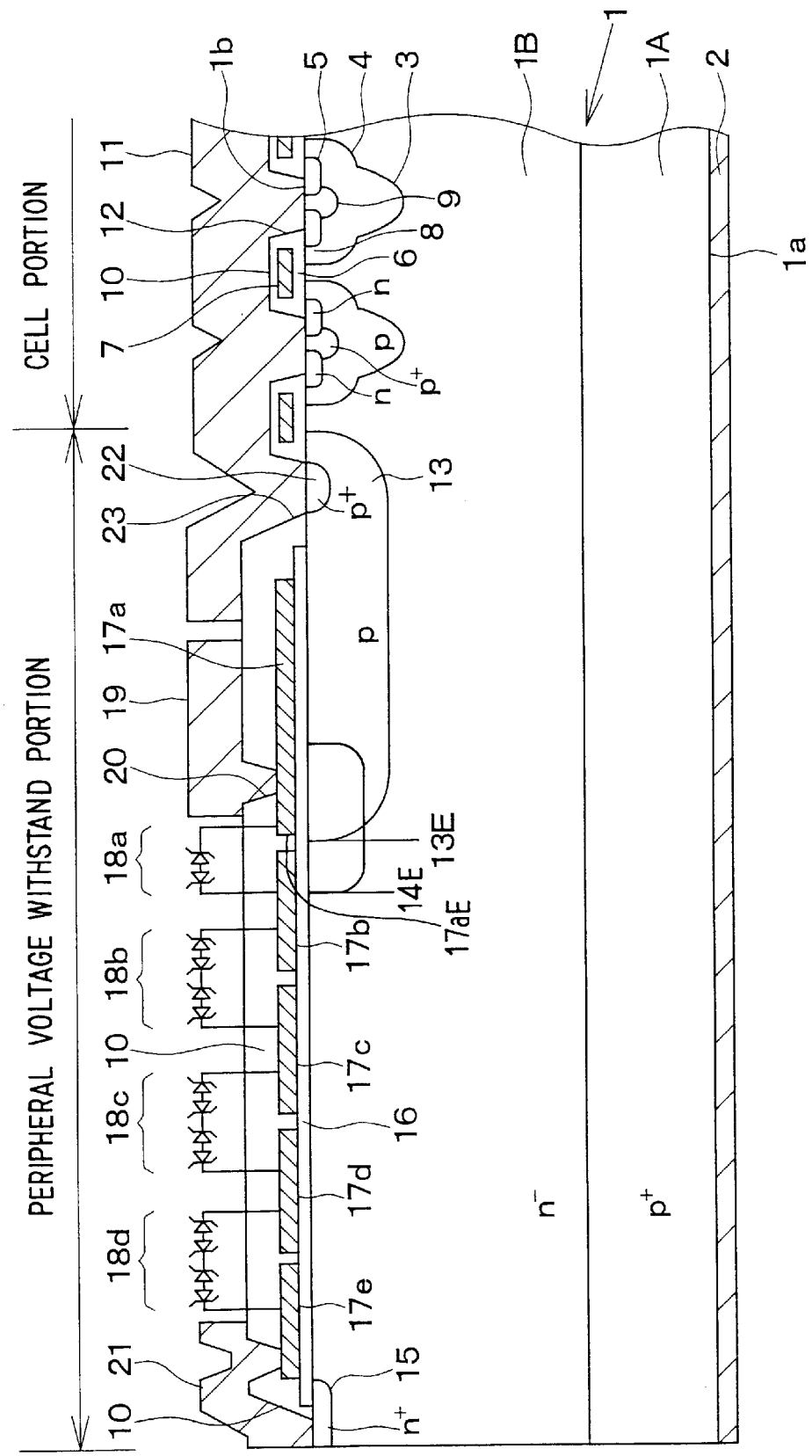
FIG. 4 is a cross sectional view showing a semiconductor device according to a modified embodiment of the present invention.

If the most peripheral well region 14 is a resurf type that is completely depleted when the reverse bias is applied to the semiconductor device, as shown in FIG. 4, it is necessary to locate the peripheral edge 13E of the peripheral p type well region 13 between the field plate ring 17a and the field plate ring 17b instead of the peripheral portion 14E of the most peripheral well region 14. That is, when the reverse bias is applied to a PN junction formed by the p well regions 13, 14 and the n– type layer 1B, the p well regions 13, 14 are formed so that the depletion layer extending to an inside of the p well regions 13, 14 is approximately located between the field plate ring 17a and the field plate ring 17b.

In the first embodiment, the withstand voltage of the peripheral voltage withstand portion is decreased by eliminating the most peripheral well region 14, and the n– type layer 1B of the present semiconductor device is defined so that an impurity concentration thereof is lower and a thickness thereof is larger than that of the related art semiconductor device illustrated in FIG. 5. However, a thickness of the n– type layer 1B interposed between the p type well region 3 and the p+ type layer 1A can be increased by decreasing the depth of the p type well region 3 formed on the surface region of the n– type layer 1B in the cell portion. According to the configuration, it is possible to increase the withstanding voltage of the cell portion.

Further, in the first embodiment, the withstanding voltage of the cell portion of the semiconductor device of the present invention remains that of the related semiconductor device illustrated in FIG. 3, but withstanding voltage of the peripheral voltage withstand portion is 70V or more lower than that of the cell portion. However, if characteristics of the semiconductor elements formed in the cell portion are not affected, the withstand voltage of the peripheral voltage withstand portion of the semiconductor device of the present invention can remain that of the related semiconductor device, and the withstanding voltage of the cell portion is defined as 70V or more larger than that of the peripheral voltage withstand portion.

Resistors can alternatively be adapted instead of the Zener diodes 18a–18d as protection elements. The number of the field plate rings 17a–17e in FIG. 1 is 5; however fewer or more plate rings may alternatively be used. Further, in the above embodiment, the field plate ring 17a located at the innermost side of the field plate rings 17a–17e is electrically connected to the gate electrode 7. However, the field plate ring 17a can alternatively be connected to the emitter electrode 11 instead of the gate electrode 7.

In the above embodiment, an N channel type IGBT of which the first conductive type corresponds to an n type and the second conductive type corresponds to p type is described. However, a P channel type IGBT of which a first conductive type corresponds to a p type and the second conductive type corresponds to an n type can alternatively be adapted. The present invention can be adapted for use not only with a planer type vertical IGBT as mentioned above but also with a trench gate type IGBT or the like.

An IGBT having an emitter electrode located on the surface 1b of the semiconductor substrate 1 can alternatively be adapted for use in the present invention. Further, a MOSFET of which a substrate and a layer are constructed by the same conductive type can alternatively be adapted for use in the present invention instead of the IGBT of which the p+ type substrate 1A and n− type layer 1B are constructed by different conductive types.

While the above description is of the preferred embodiments of the present invention, it should be appreciated that the invention may be modified, altered, or varied without deviating from the scope and fair meaning of the following claims.

What is claimed is:

1. A semiconductor device having a peripheral portion for protecting a cell portion from a surge voltage comprising:
    a semiconductor substrate having a first conductive type semiconductor layer and a main surface corresponding to a side of the semiconductor layer of the semiconductor substrate;
    a semiconductor element, which is included in the cell portion, including an electrode formed on the main surface of the semiconductor substrate and a gate formed on the main surface of the semiconductor substrate through a gate isolation film, wherein a current flows via the electrode when a voltage is applied to the gate;
    a first semiconductor region with a second conductive type formed on a surface portion of the semiconductor layer located in the peripheral portion surrounding the cell portion;
    a field isolation film formed on the semiconductor layer so as to extend from the first semiconductor region in a further peripheral direction thereof; and
    field plate rings formed on the semiconductor layer as conductive rings surrounding the cell portion;
    wherein the first semiconductor region is formed so that a peripheral edge thereof is located between a first field plate ring that corresponds to one of the field plate rings located at an innermost side of the first semiconductor region and a second field plate ring that corresponds to one of the field plate rings adjacent the first plate ring.

2. The semiconductor device according to claim 1, wherein the first ring is electrically connected to the gate.

3. The semiconductor device according to claim 2, wherein the second semiconductor region is defined so that a withstanding voltage of the peripheral region is 70V or more lower than that of the cell region.

4. The semiconductor device according to claim 2, wherein an impurity concentration and a thickness of the second semiconductor region is defined so that a withstanding voltage of the peripheral region is 70V or more lower than that of the cell region.

5. The semiconductor device according to claim 1, wherein the field plate rings have a third field plate ring located at an outermost side thereof, and being electrically connected to the semiconductor layer.

6. The semiconductor device according to claim 1, wherein the semiconductor element has a second semiconductor region formed on the surface region of the semiconductor layer, the second semiconductor region being defined so that a withstanding voltage of the peripheral region is lower than that of the cell region.

7. The semiconductor device according to claim 1, wherein the semiconductor element has a second semiconductor region formed on the surface region of the semiconductor layer, a curvature radius of a curve portion of the second semiconductor region being defined so that a withstanding voltage of the peripheral region is lower than that of the cell region.

8. The semiconductor device according to claim 1, further comprising;
    protection elements installed between each of the field plate rings.

9. A semiconductor device comprising:
    a semiconductor chip including a main surface and a first conductive type semiconductor layer, wherein the first type semiconductor layer is disposed to a side of the main surface, an element portion is defined in the first conductive type semiconductor layer and a peripheral portion is also defined at a periphery of the element portion;
    a semiconductor element formed in the element portion;
    first and second main electrodes connected electrically to the semiconductor element;
    a second conductive type region formed on a surface region of the first conductive type semiconductor layer at the peripheral portion and near the element portion along the periphery of the element portion, and forming a PN junction in conjunction with the first conductive type semiconductor layer;
    a first conductive type region formed on the surface region of the first conductive type semiconductor layer at the peripheral portion so as to be separated from the element portion and to have a predetermined concentration higher than the first conductive type semiconductor layer;
    an isolation film formed on the first conductive type semiconductor layer disposed between the first and the second conductive type regions; and
    a plurality of field plate rings located on the isolation film along a periphery of the second conductive type region;
    wherein the second conductive type region is defined in approximately the same voltage of the first main electrode, the first conductive type region is defined in approximately the same voltage of the second main electrode, a first voltage that approximately equals a voltage applied to the second conductive type region is applied to a first one of the field plate rings located at the innermost side thereof, and a second voltage that is closer than the first voltage to a voltage applied to the first conductive type region is applied to a second one of the field plate rings adjacent to the first one of the field plate rings, a third voltage that approximately equals a voltage applied to the first conductive type region is applied to a third one of the field plate rings located at the outermost side thereof, and a fourth voltage that is closer than the third voltage to a voltage applied to the second conductive type region is applied to a fourth one of the field plate rings adjacent to the third one of the field plate rings, and a peripheral edge of the second conductive type region is formed so that a peripheral edge of a depletion layer, which extends in the second conductive type region when a reverse bias is applied to the PN junction, is located between the first one of the field plate rings and the second one of the field plate rings.

10. The semiconductor device according to claim 9, wherein an impurity concentration of the second conductive type region is higher than that of the first conductive type layer, and a peripheral edge of the second conductive type region is disposed between the first one and the second one of the field plate rings.

11. The semiconductor device according to claim 10, further comprising:

a low impurity region having a predetermined impurity concentration lower than an impurity concentration of the second conductive type region, formed on the first conductive type layer at an outer periphery of the second conductive type region, and combined with the peripheral edge of the second conductive type region.

12. The semiconductor device according to claim 11, wherein the impurity concentration of the low impurity region is so defined that the low impurity region is completely depleted when the reverse bias is applied to the PN junction.

13. The semiconductor device according to claim 10, wherein the semiconductor element includes a MOS cell configuration, a source voltage of the MOS cell configuration is applied to the first main electrode, and one of the source voltage and a gate voltage of the MOS cell configuration is applied to the first field plate ring.

14. The semiconductor device according to claim 13, wherein the second main electrode is formed on a reverse surface of the semiconductor substrate opposite to the main surface, the semiconductor element includes an insulated gate field effect transistor, the second main electrode is connected to the second conductive type region and corresponds to a collector electrode of the insulated gate field effect transistor, and the first main electrode corresponds to an emitter electrode of the insulated gate field effect transistor.

15. The semiconductor device according to claim 14, further comprising;

protection elements installed between each of the field plate rings so as to be inter-connected in a back to back configuration.

16. The semiconductor device according to claim 13, further comprising;

protection elements installed between each of the field plate rings so as to be inter-connected in a back to back configuration.

17. The semiconductor device according to claim 9, further comprising:

a low impurity region having a predetermined impurity concentration lower than an impurity concentration of the second conductive type region and, formed on the first conductive type layer at an outer periphery of the second conductive type region, and combined with the peripheral edge of the second conductive type region.

18. The semiconductor device according to claim 17, wherein the impurity concentration of the low impurity region is defined so that the low impurity region is completely depleted when the reverse bias is applied to the PN junction.

19. The semiconductor device according to claim 9, further comprising;

protection elements installed between each of the field plate rings so as to be inter-connected in a back to back configuration.

20. The semiconductor device comprising:

a semiconductor chip including a main surface, a reverse surface, first and second conductive type semiconductor layers, wherein the first type semiconductor layer is disposed to a side of the main surface, the second type semiconductor layer is disposed to a side of the reverse surface, an element portion that includes plurality of MOS type cells for forming an insulated gate field effect transistor is defined inside of the semiconductor chip and a peripheral portion is also defined in the semiconductor chip around a periphery of the element portion;

emitter and collector electrodes for connecting the plurality of the MOS type cells in a parallel connection, the emitter electrode is formed on a side of the main surface, and the collector electrode is formed on a side of the reverse surface;

a second conductive type region formed on a surface region of the first conductive type semiconductor layer at the periphery portion and near the element portion along the peripheral of the element portion, and forming a PN junction in conjunction with the first conductive type semiconductor layer;

a first conductive type region formed on the surface region of the first conductive type semiconductor layer at the peripheral portion so as to be separated from the element portion and be a predetermined concentration higher than the first conductive type semiconductor layer;

an isolation film formed on the first conductive type semiconductor layer disposed between the first and the second conductive type regions;

a plurality of field plate rings located on the isolation film along a periphery of the second conductive type region;

protection elements installed between each of the field plate rings;

wherein the second conductive type region is electrically connected to the emitter electrode, a first one of the field plate rings located at the innermost side thereof is electrically connected to a common gate of the MOS type cells, a peripheral edge of the second conductive type region is located between the one of the field plate rings located at the innermost side thereof and a second one of the field plate rings neighboring the first one of the field plate rings, and a third one of the field plate rings located at the outermost side thereof electrically connected to the first conductive type region.

21. The semiconductor device according to claim 20, wherein the protection elements are Zener diodes innerconnected in a back to back configuration.

* * * * *